United States Patent
Bhattacharjee et al.

(10) Patent No.: US 8,990,173 B2
(45) Date of Patent: Mar. 24, 2015

(54) METHOD AND APPARATUS FOR SELECTING AN OPTIMAL DELETE-SAFE COMPRESSION METHOD ON LIST OF DELTA ENCODED INTEGERS

(75) Inventors: Bishwaranjan Bhattacharjee, Yorktown Heights, NY (US); Lipyeow Lim, Hawthorne, NY (US); Timothy Ray Malkemus, Leander, TX (US); George Andrei Mihaila, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1894 days.

(21) Appl. No.: 12/056,979

(22) Filed: Mar. 27, 2008

(65) Prior Publication Data

US 2009/0248723 A1 Oct. 1, 2009

(51) Int. Cl.
*G06F 7/00* (2006.01)
*H03M 7/30* (2006.01)

(52) U.S. Cl.
CPC ........................................ *H03M 7/30* (2013.01)
USPC .......................................................... 707/693

(58) Field of Classification Search
USPC ............. 707/999.002, 999.003, 999.104, 693
See application file for complete search history.

(56) References Cited

U.S. PATENT DOCUMENTS

| 5,913,209 | A   | * | 6/1999  | Millett ................................. 1/1 |
| 6,055,526 | A   |   | 4/2000  | Ambroziak |
| 6,058,392 | A   |   | 5/2000  | Sampson et al. |
| 7,143,088 | B2  | * | 11/2006 | Green et al. .......................... 1/1 |
| 7,281,004 | B2  | * | 10/2007 | Lightstone et al. .................... 1/1 |
| 2004/0128285 | A1 | * | 7/2004  | Green et al. ...................... 707/3 |
| 2005/0192978 | A1 | * | 9/2005  | Lightstone et al. ........... 707/100 |
| 2009/0157712 | A1 | * | 6/2009  | De Peuter et al. ............. 707/101 |
| 2011/0208703 | A1 | * | 8/2011  | Fisher et al. .................. 707/692 |

* cited by examiner

*Primary Examiner* — Hosain Alam
*Assistant Examiner* — Eliyah S Harper
(74) *Attorney, Agent, or Firm* — Preston J Young; Ryan, Mason & Lewis, LLP

(57) ABSTRACT

Techniques are disclosed for selecting a delete-safe compression method for a plurality of delta encoded data values (e.g., delta encoded integers or deltas). For example, a computer-implemented method for selecting an optimal delete-safe compression algorithm from among two or more compression algorithms for use on a plurality of delta encoded data values includes the following steps. The maximum number of data values eliminated by each of the two or more compression algorithms is computed. For the plurality of delta encoded data values to be compressed, the minimum size of the plurality of delta encoded data values before compression thereof is computed. A delete-safe threshold value is computed based on the minimum size of the plurality of delta encoded data values. Then, the compression algorithm is selected from the two or more compression algorithms that achieves the delete-safe threshold value.

20 Claims, 5 Drawing Sheets

METHOD AND APPARATUS FOR SELECTING AN OPTIMAL DELETE-SAFE COMPRESSION METHOD ON LIST OF DELTA ENCODED INTEGERS

FIELD OF THE INVENTION

The present invention generally relates to the field of databases, and more particularly relates to compression of lists of delta encoded integers such as those that can be found in a compressed non-unique index of a database system.

BACKGROUND OF THE INVENTION

Delta encoding is a technique for storing or transmitting data in the form of differences between sequential data values, rather than the complete set of data values. The differences are referred to as "delta encoded integers" or, more simply, "deltas." In general, the difference between two data values is the information required to obtain one value from the other.

Lists of deltas have wide applicability in many applications. One particular application in which such lists are used is compressed database indexes. A non-unique database index stores an efficient mapping between a key to a list of row identifiers (RIDs). In compressed indexes, these lists of RIDs are often first encoded using delta encoding, namely, each RID (except the first one) in the list is encoded as the difference from the previous RID.

These delta encoded lists of RIDs are then further compressed using a plurality of compression methods. One exemplary method is dictionary-based compression, where common bit patterns in the deltas are replaced with a short codeword.

An important property in compressed database indexes is that deletion of a RID in a RID list should not result in an expansion in the amount of space required to store the compressed RID list. A compression method and/or a compressed index that exhibits this property is said to be "delete-safe." The delete-safe property is critical, because if the index occupies all the free space on disk, the user still expects a row deletion operation to succeed. Without the delete-safe property, the row deletion operation could fail, because the index after the delete requires more storage space on disk than before the delete operation.

However, one problem with choosing a dictionary-based method arbitrarily to compress a list of delta encoded integers is that the resultant index may not be delete-safe.

SUMMARY OF THE INVENTION

Principles of the invention provide a method for selecting a delete-safe compression method for a plurality of delta encoded data values (e.g., delta encoded integers or deltas).

In one embodiment, a computer-implemented method for selecting an optimal delete-safe compression algorithm from among two or more compression algorithms for use on a plurality of delta encoded data values comprises the following steps. The maximum number of data values eliminated by each of the two or more compression algorithms is computed. For the plurality of delta encoded data values to be compressed, the minimum size of the plurality of delta encoded data values before compression thereof is computed. A delete-safe threshold value is computed based on the minimum size of the plurality of delta encoded data values. Then, the compression algorithm that achieves the delete-safe threshold value is selected from the two or more compression algorithms.

Advantageously, illustrative principles of the invention provide for computing a bound for how many bits a compression scheme can save in order to be delete-safe, based on the size of the deltas in the list. The invention then selects the compression scheme that falls within the safe boundary.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

While principles of the present invention will be described herein in the context of a practical, real-world application such as a database record management system, the invention is not so limited. It is also to be understood that the invention is not intended to be limited to any particular type of data that the database stores (e.g., employee, financial, demographic, geographic records, etc.). Also, although not limited thereto, principles of the application are particularly suitable for implementation in a DB2 database system (IBM Corporation, Armonk N.Y.) or the like.

In accordance with illustrative principles of the invention, a delete-safe compression method can be chosen at various granularity levels, e.g., an index level, a page level, a rid-list level. By way of example only, an index in a database may be the B+-tree. A page may be a fixed size block of storage space that is used to hold data in a database. Each node of a B+-tree index in a database, for example, would correspond to one page. An example of a rid-list may be the structure shown in and described below in the context of FIG. 1.

In general, a first step is to pick the granularity at which to apply the compression algorithm. Assume we make the decision based on a page level. Therefore, for each page, we select the compression algorithm that compresses out (eliminates), at most, ½*[minimum size of the uncompressed deltas in bits+size of flag−1] bits. It is to be understood that a fractional part of a result of the above computation should be truncated to ensure an integer result. This can be accomplished via application of a floor function. In one embodiment, the minimum size could be found by scanning through (examining) all the deltas and finding the minimum size. Alternatively, the minimum size might be fixed by a user, i.e., the user may apply the inventive methodology only on deltas that have a minimum size of 16 bits, for example.

Figure 1:
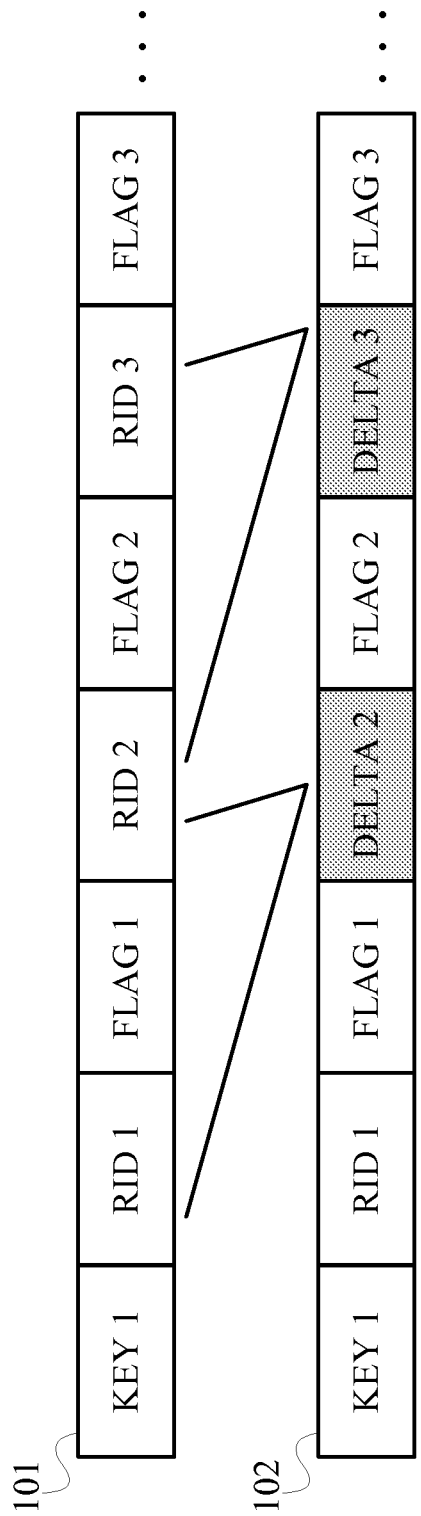
FIG. 1 shows an exemplary RID list and an exemplary delta encoded RID list.

FIG. 1 shows an exemplary RID list of a database index and the corresponding exemplary delta encoded RID list. Reference numeral 101 refers to the exemplary list of RIDs and the flag associated with each RID. Reference numeral 102 refers to the exemplary list of delta-encoded RIDs, where each delta is the difference of the current RID from its previous RID. The flags are kept uncompressed.

Figure 2:
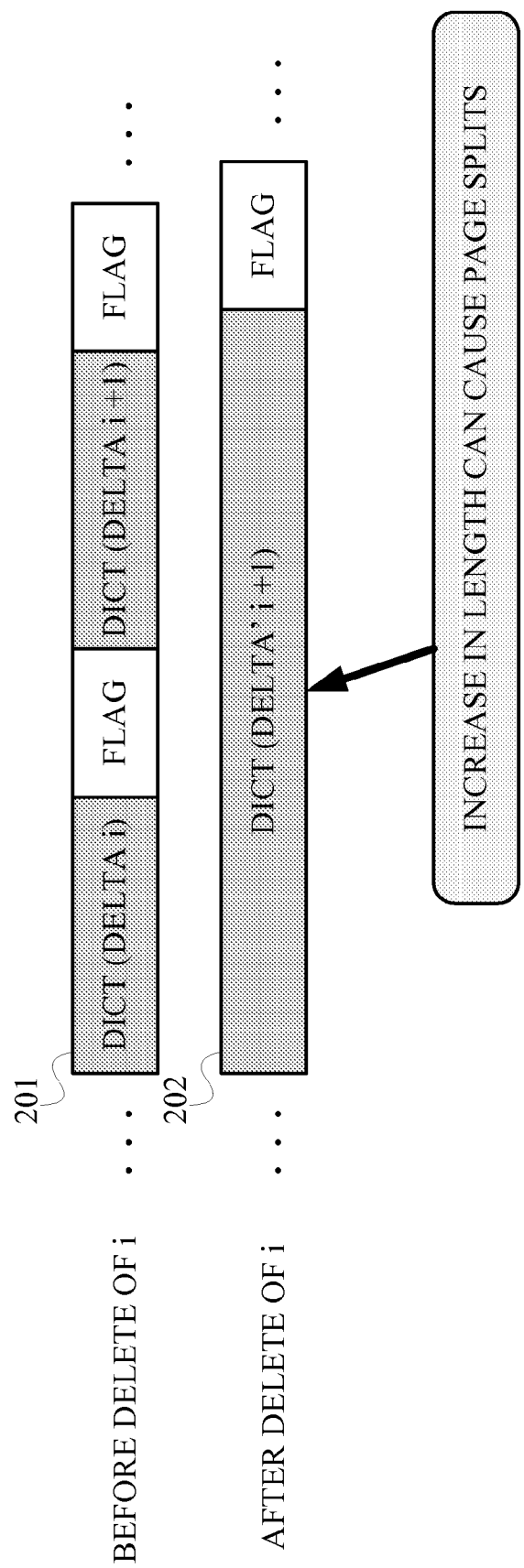
FIG. 2 shows an exemplary fragment of a delta-encoded list that has been further encoded using a dictionary scheme before a row delete and after a row delete.

FIG. 2 depicts an exemplary fragment of a delta-encoded list that has been further encoded using a dictionary scheme before a row delete and after a row delete. Reference numeral 201 refers to the two consecutive delta and flag pairs before the deletion of row i. Reference numeral 202 refers to the resultant fragment of the list after the deletion of row i. For a dictionary compression method that is non-delete safe, the resultant compressed delta i+1 may require more storage space than the sum of the two delta and flag pairs prior to the delete operation.

Figure 3A:
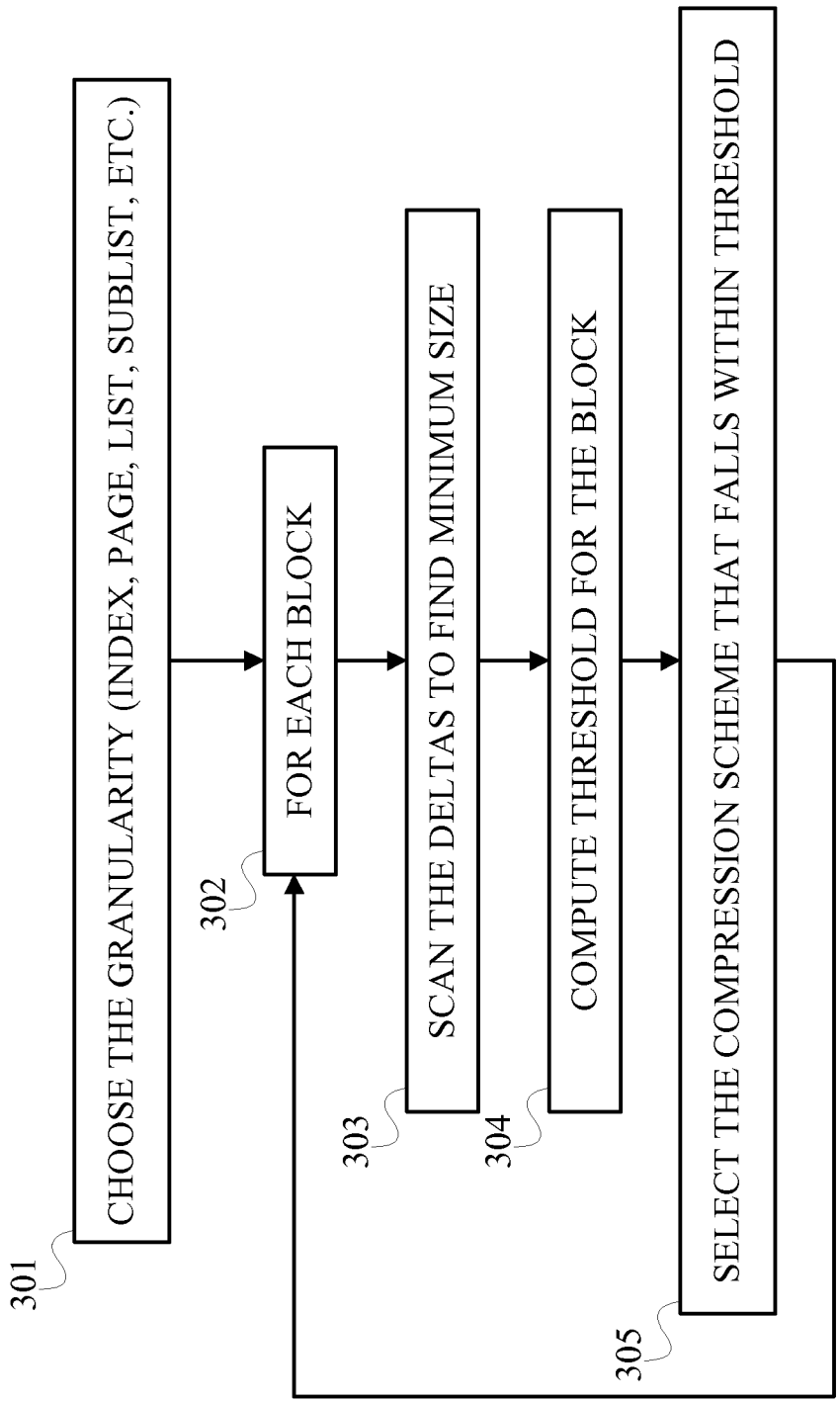
FIG. 3A is an operational flow diagram illustrating an overall exemplary selection process of the present invention.

FIG. 3A depicts a flow diagram describing the steps of an illustrative embodiment of the present invention. Step 301 picks the granularity at which to apply the compression method. In an exemplary embodiment, the process makes the compression decisions at the page level. Step 302 iterates over each page. For each page, step 303 finds the minimum size of the uncompressed deltas in number of bits. In some embodiments, the size of the uncompressed deltas is a constant such as 16 bits. In those embodiments, no scanning is required to find the minimum delta size. In the embodiments where the size of each deltas is not a constant, the user has to ensure that the minimum size is valid across row insertions. That is, if the row to be inserted does not have a delta more than the minimum size, the methodology should not be applied to the delta for that row. Using the minimum delta size, step 304 computes a threshold using the following formula: ½*[minimum size of the uncompressed deltas in bits+ size of flag−1] bits. Again, any fractional part of the formula result is truncated to yield an integer. Step 305 picks the compression method that saves, at most, the threshold number of bits. In order to execute step 305, the maximum of bits saved by each candidate compression method needs to be computed.

It is to be appreciated that the above process in FIG. 3A can be applied in several ways. For example, in one embodiment, the process may be used to select a single global compression scheme for the entire list of deltas that is delete-safe. In another embodiment, the process may be used within a loop to select a local compression scheme for a sub-list of the entire list of deltas that is delete-safe.

Figure 3B:
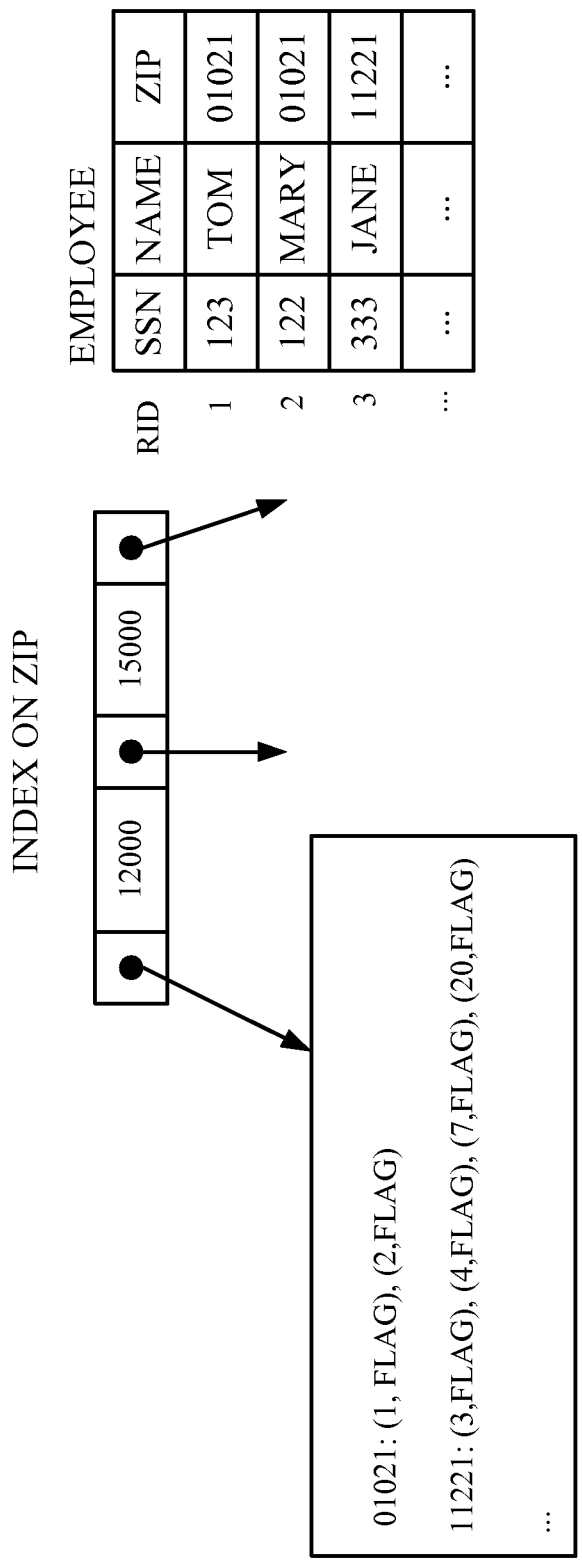
FIG. 3B shows application of the selection process to an example.

As shown in FIG. 3B, we consider compressing the following rid-list for zip 11221 with two dictionary-based compression schemes:

Ridlist for zip 11221: (3,flag), (4,flag), (7,flag), (20,flag), (147,flag)

Delta list for zip 11221: (3,flag), (1,flag), (3,flag), (13,flag), (127,flag)

Delta list for zip 11221 in binary: (11,flag), (1,flag), (11,flag), (1101,flag), (111111,flag)

In this case, the minimum delta size is one bit, size of flag is eight bits, thus the threshold can be computed as: ½*(1+ 8−1)=4 bits.

Now suppose that a first compression scheme (schema 1) replaces occurrences of bit pattern "111" with "1", and suppose a second compression scheme (schema 2) replaces occurrences of bit pattern "111111" with "1". The savings in bits for schema 1 and 2 are therefore two and five, respectively. Using our invention, schema 2 is not delete-safe and should not be used. Schema 1, however, is delete-safe, and can be applied to any of the deltas in the list.

Figure 4:
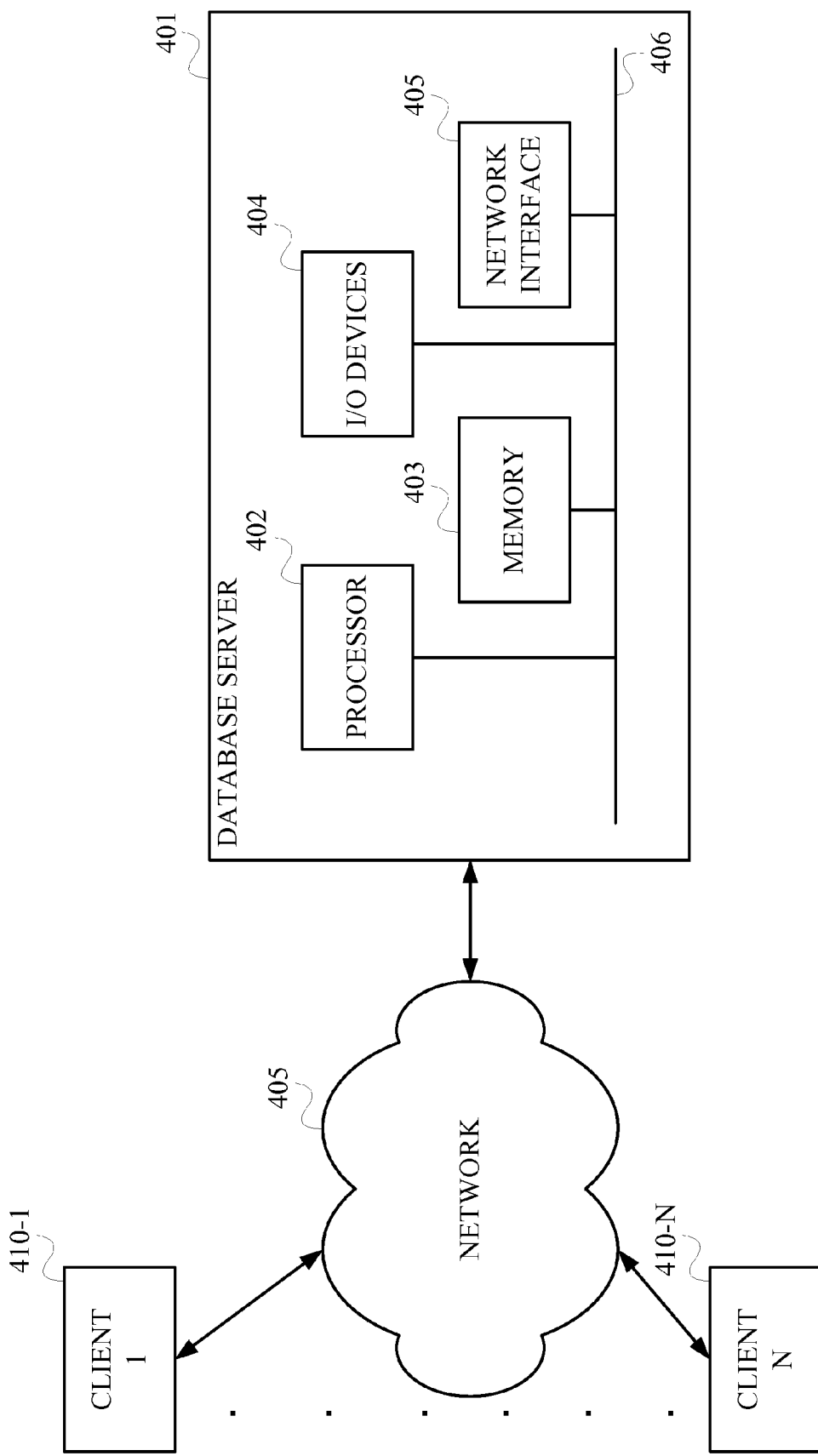
FIG. 4 shows a block diagram of an exemplary database server and network environment in which an exemplary process of the present invention may be implemented.

FIG. 4 shows a block diagram of an exemplary database record management system in which an exemplary process of the present invention may be implemented. More particularly, FIG. 4 illustrates a database server 401 which receives queries and/or data from one or more clients 410-1 through 410-N over network 405 (e.g., internet or intranet). It is assumed that database server 401 hosts a database record management system which is configured to implement a method for selecting an optimal delete-safe compression method on a list of deltas, according to principles of the invention.

That is, FIG. 4 illustrates a computer system (in the form of a database server) in accordance with which one or more components/steps of the techniques (e.g., components and methodologies described above in the context of FIGS. 1 through 3B) may be implemented, according to an embodiment of the invention.

It is to be understood that the individual components/steps may be implemented on one such computer system or on more than one such computer system. In the case of an implementation on a distributed computing system, the individual computer systems and/or devices may be connected via a suitable public network. However, the system may be realized via private or local networks. In any case, the invention is not limited to any particular network.

As shown, the computer system includes processor 402, memory 403, input/output (I/O) devices 404, and network interface 405, coupled via a computer bus 406 or alternate connection arrangement.

It is to be appreciated that the term "processor" as used herein is intended to include any processing device, such as, for example, one that includes a CPU and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. The memory may be considered a computer or machine readable storage medium.

In addition, the phrase "input/output devices" or "I/O devices" as used herein is intended to include, for example, one or more input devices (e.g., keyboard, mouse, etc.) for entering data to the processing unit, and/or one or more output devices (e.g., display, etc.) for presenting results associated with the processing unit.

Still further, the phrase "network interface" as used herein is intended to include, for example, one or more transceivers to permit the computer system to communicate with another computer system via an appropriate communications protocol.

Accordingly, software components including instructions or code for performing the methodologies described herein may be stored in one or more of the associated memory devices (e.g., ROM, fixed or removable memory) and, when ready to be utilized, loaded in part or in whole (e.g., into RAM) and executed by a CPU.

In any case, it is to be appreciated that the techniques of the invention, described herein and shown in the appended figures, may be implemented in various forms of hardware, software, or combinations thereof, e.g., one or more operatively programmed general purpose digital computers with associated memory, implementation-specific integrated circuit(s), functional circuitry, etc. Given the techniques of the invention provided herein, one of ordinary skill in the art will be able to contemplate other implementations of the techniques of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A computer-implemented method for selecting an optimal delete-safe compression algorithm from among two or more compression algorithms for use on a data block comprising a plurality of delta encoded data values, the method comprising the steps of:
   computing a maximum number of data values eliminated by compressing the data block with each of the two or more compression algorithms;
   for the plurality of delta encoded data values to be compressed, computing a minimum size of the plurality of delta encoded data values before compression thereof;
   computing a delete-safe threshold value based on the minimum size of the plurality of delta encoded data values; and
   enabling delete safe compression of the data block by selecting the compression algorithm from the two or more compression algorithms for which the maximum number of data values eliminated does not exceed the delete-safe threshold value, wherein delete safe compression is a property in which deletion of a delta encoded data value from a compressed data block does not cause an expansion of storage space of the compressed data block.

2. The method of claim 1, wherein at least one of the two or more compression algorithms comprises a dictionary-based compression algorithm.

3. The method of claim 1, further comprising the step of selecting a level of granularity at which the selected compression algorithm is to be performed.

4. The method of claim 3, wherein the level of granularity comprises a page level of granularity.

5. The method of claim 3, wherein the level of granularity comprises an index level of granularity.

6. The method of claim 3, wherein the level of granularity comprises a list level of granularity.

7. The method of claim 1, wherein the minimum size of the plurality of delta encoded data values is a constant value.

8. The method of claim 1, wherein the minimum size of the plurality of delta encoded data values is a non-constant value.

9. The method of claim 1, wherein the step of computing the delete-safe threshold value based on the minimum size of the plurality of delta encoded data values further comprises using a formula of one-half multiplied by the minimum size of the uncompressed delta encoded data values plus a size of a flag minus one.

10. The method of claim 1, wherein the plurality of delta encoded data values comprise a plurality of delta encoded integers associated with a database index.

11. The method of claim 10, wherein a delta encoded integer represents a difference between a first row identifier in the database index and a second row identifier in the database index.

12. The method of claim 1, wherein the plurality of delta encoded data values comprises an entire set of delta encoded data values to be compressed.

13. The method of claim 1, wherein the plurality of delta encoded data values comprises a portion of an entire set of delta encoded data values to be compressed.

14. An article of manufacture for selecting an optimal delete-safe compression algorithm from among two or more compression algorithms for use on a data block comprising a plurality of delta encoded data values comprising a non-transitory computer readable storage medium including one or more programs which when executed by a computer implement the steps of;
   computing a maximum number of data values eliminated by compressing the data block with each of the two or more compression algorithms;
   for the plurality of delta encoded data values to be compressed, computing a minimum size of the plurality of delta encoded data values before compression thereof;
   computing a delete-safe threshold value based on the minimum size of the plurality of delta encoded data values; and
   enabling delete safe compression of the data block by selecting the compression algorithm from the two or more compression algorithms for which the maximum number of data values eliminated does not exceed the delete-safe threshold value, wherein delete safe compression is a property in which deletion of a delta encoded data value from a compressed data block does not cause an expansion of storage space of the compressed data block.

15. Apparatus for selecting an optimal delete-safe compression algorithm from among two or more compression algorithms for use on a data block comprising a plurality of delta encoded data values, the apparatus comprising:
   a memory; and
   at least one processor coupled to the memory and operative to: (i) compute a maximum number of data values eliminated by compressing the data block with each of the two or more compression algorithms; (ii) for the plurality of delta encoded data values to be compressed, compute a minimum size of the plurality of delta encoded data values before compression thereof; (iii) compute a delete-safe threshold value based on the minimum size of the plurality of delta encoded data values; and (iv) enable delete safe compression of the data block by selecting the compression algorithm from the two or more compression algorithms for which the maximum number of data values eliminated does not exceed the delete-safe threshold value, wherein delete safe compression is a property in which deletion of a delta encoded data value from a compressed data block does not cause an expansion of storage space of the compressed data block.

16. The apparatus of claim 15, wherein at least one of the two or more compression algorithms comprises a dictionary-based compression algorithm.

17. The apparatus of claim 15, wherein the processor is further operative to select a level of granularity at which the selected compression algorithm is to be performed.

18. The apparatus of claim 15, wherein the minimum size of the plurality of delta encoded data values is one of a constant value and a non-constant value.

19. The apparatus of claim 15, wherein computing the delete-safe threshold value based on the minimum size of the plurality of delta encoded data values further comprises using a formula of one-half multiplied by the minimum size of the uncompressed delta encoded data values plus a size of a flag minus one.

20. The apparatus of claim 15, wherein the plurality of delta encoded data values comprise a plurality of delta encoded integers associated with a database index.

* * * * *